United States Patent
Jacob et al.

(10) Patent No.: US 10,686,003 B2
(45) Date of Patent: Jun. 16, 2020

(54) RADIATION DETECTOR ASSEMBLY

(71) Applicant: General Electric Company, Schenectady, NY (US)

(72) Inventors: Biju Jacob, Schenectady, NY (US); Habib Vafi, Brookfield, WI (US); Brian David Yanoff, Schenectady, NY (US); Jeffery Jon Shaw, Ballston Lake, NY (US); Jianjun Guo, Ballston Spa, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 596 days.

(21) Appl. No.: 14/985,739

(22) Filed: Dec. 31, 2015

(65) Prior Publication Data
US 2017/0194374 A1    Jul. 6, 2017

(51) Int. Cl.
| | | |
|---|---|---|
| G01T 1/24 | (2006.01) | |
| H01L 27/146 | (2006.01) | |
| H04N 5/378 | (2011.01) | |

(52) U.S. Cl.
CPC ........ H01L 27/14636 (2013.01); G01T 1/247 (2013.01); H01L 27/1469 (2013.01); H01L 27/14634 (2013.01); H01L 27/14643 (2013.01); H01L 27/14658 (2013.01); H01L 27/14689 (2013.01); H04N 5/378 (2013.01)

(58) Field of Classification Search
CPC ........................... H01L 27/14636; G01T 1/247
See application file for complete search history.

(56) References Cited

U.S. PATENT DOCUMENTS

| | | | | |
|---|---|---|---|---|
| 5,005,195 A |   | 4/1991 | Lanza et al. | |
| 5,336,879 A | * | 8/1994 | Sauer | H01L 27/14643 |
| | | | | 250/208.1 |
| 5,391,881 A | * | 2/1995 | Jeuch | G01T 1/24 |
| | | | | 250/370.09 |
| 5,436,458 A | * | 7/1995 | Tran | G01T 1/2018 |
| | | | | 250/370.09 |
| 5,464,984 A | * | 11/1995 | Cox | G01T 1/2018 |
| | | | | 250/370.11 |

(Continued)

FOREIGN PATENT DOCUMENTS

| | | |
|---|---|---|
| EP | 1173007 A2 | 1/2002 |
| EP | 2950345 A1 | 12/2015 |

(Continued)

OTHER PUBLICATIONS

U.S. Appl. No. 14/985,785, filed Dec. 31, 2015, Jacob et al.

(Continued)

*Primary Examiner* — David P Porta
*Assistant Examiner* — Djura Malevic
(74) *Attorney, Agent, or Firm* — Fletcher Yoder, P.C.

(57) ABSTRACT

Various approaches are discussed for using four-side buttable CMOS tiles to fabricate detector panels, including large-area detector panels. Fabrication may utilize pads and interconnect structures formed on the top or bottom of the CMOS tiles. Electrical connection and readout may utilize readout and digitization circuitry provided on the CMOS tiles themselves such that readout of groups or sub-arrays of pixels occurs at the tile level, while tiles are then readout at the detector level such that readout operations are tiered or multi-level.

20 Claims, 10 Drawing Sheets

(56) References Cited

U.S. PATENT DOCUMENTS

| | | | | |
|---|---|---|---|---|
| 5,712,483 | A * | 1/1998 | Boone | G01T 1/1645 250/367 |
| 5,859,463 | A * | 1/1999 | Liu | H01L 27/14601 257/234 |
| 5,886,353 | A * | 3/1999 | Spivey | A61B 6/4233 250/208.1 |
| 5,981,959 | A * | 11/1999 | Apte | G01T 1/2018 250/367 |
| 6,035,013 | A * | 3/2000 | Orava | G01T 1/2928 378/37 |
| 6,177,236 | B1 * | 1/2001 | Apte | G21K 4/00 430/320 |
| 6,207,944 | B1 * | 3/2001 | Spartiotis | H01L 27/14601 250/208.1 |
| 6,262,421 | B1 * | 7/2001 | Tran | H01L 21/8222 250/370.08 |
| 6,323,475 | B1 * | 11/2001 | Spartiotis | H01L 27/14634 250/208.1 |
| 6,380,880 | B1 * | 4/2002 | Bidermann | H04N 1/195 341/155 |
| 6,403,964 | B1 * | 6/2002 | Kyyhkynen | H04N 5/379 250/370.09 |
| 6,510,195 | B1 | 1/2003 | Chappo et al. | |
| 6,534,772 | B1 * | 3/2003 | Chhabra | G01T 1/20 250/367 |
| 6,703,617 | B1 * | 3/2004 | Spartiotis | H01L 27/14676 250/370.09 |
| 6,759,660 | B2 * | 7/2004 | Izumi | G02F 1/13336 250/370.01 |
| 6,784,432 | B2 * | 8/2004 | Wieczorek | G01T 1/2018 250/367 |
| 6,800,836 | B2 * | 10/2004 | Hamamoto | H04N 3/1575 250/208.1 |
| 6,946,661 | B2 | 9/2005 | Vafi et al. | |
| 7,009,646 | B1 * | 3/2006 | Fossum | H01L 27/14601 348/294 |
| 7,443,435 | B2 * | 10/2008 | Loose | H04N 5/243 330/278 |
| 7,606,346 | B2 * | 10/2009 | Tkaczyk | A61B 6/032 250/370.09 |
| 7,737,390 | B2 * | 6/2010 | Sarig | H01L 27/14643 250/208.1 |
| 7,746,400 | B2 * | 6/2010 | Mo | H04N 5/361 250/208.1 |
| 8,117,741 | B2 * | 2/2012 | Spartiotis | H01L 23/544 29/832 |
| 8,188,417 | B2 | 5/2012 | Kobayashi et al. | |
| 8,420,433 | B2 * | 4/2013 | Jackson | H01L 27/14634 257/443 |
| 8,493,569 | B2 * | 7/2013 | Kapner | G01D 5/38 356/499 |
| 8,718,226 | B2 * | 5/2014 | Jorritsma | G01T 1/00 250/370.09 |
| 8,754,972 | B2 | 6/2014 | Brown et al. | |
| 8,798,229 | B2 * | 8/2014 | Li | A61B 6/032 250/370.09 |
| 8,928,155 | B2 * | 1/2015 | Kalliopuska | H01L 27/14661 257/777 |
| 8,952,312 | B2 * | 2/2015 | Blanquart | H01L 27/14601 250/208.1 |
| 9,012,859 | B2 * | 4/2015 | Wei | G01T 1/2018 250/370.11 |
| 9,117,721 | B1 | 8/2015 | Godfrey et al. | |
| 9,123,602 | B2 * | 9/2015 | Blanquart | H01L 27/14601 |
| 9,153,609 | B2 * | 10/2015 | Blanquart | H01L 27/14601 |
| 9,423,511 | B2 * | 8/2016 | Frach | G01T 1/1642 |
| 9,571,765 | B2 * | 2/2017 | Guo | H04N 5/369 |
| 9,588,240 | B1 * | 3/2017 | Kouada | G01T 1/247 |
| 9,599,723 | B2 * | 3/2017 | Jadrich | G01T 1/208 |
| 9,622,650 | B2 * | 4/2017 | Blanquart | H01L 27/14601 |
| 9,684,083 | B2 * | 6/2017 | Liu | G01T 1/2018 |
| 9,763,566 | B2 * | 9/2017 | Blanquart | H01L 27/14601 |
| 9,846,246 | B2 * | 12/2017 | Jadrich | G01T 1/208 |
| 9,871,073 | B1 * | 1/2018 | Konkle | G01T 1/2018 |
| 10,283,557 | B2 * | 5/2019 | Jacob | G01T 1/2018 |
| 10,299,744 | B2 * | 5/2019 | Jacob | A61B 6/4208 |
| 2002/0017611 | A1 * | 2/2002 | Tashiro | H01L 27/14609 250/370.11 |
| 2003/0155516 | A1 * | 8/2003 | Spartiotis | G01T 1/2928 250/370.09 |
| 2005/0098732 | A1 * | 5/2005 | Liu | H01L 25/042 250/370.11 |
| 2005/0265515 | A1 * | 12/2005 | Tashiro | A61B 6/032 378/20 |
| 2006/0050162 | A1 * | 3/2006 | Nakamura | H04N 5/335 348/308 |
| 2006/0192087 | A1 * | 8/2006 | Kuszpet | G01T 1/2928 250/214 R |
| 2010/0207299 | A1 | 8/2010 | DeNatale et al. | |
| 2010/0295144 | A1 * | 11/2010 | Jackson | H01L 27/14634 257/443 |
| 2011/0222659 | A1 | 9/2011 | Jorritsma et al. | |
| 2012/0188422 | A1 | 7/2012 | Cho | |
| 2013/0083887 | A1 * | 4/2013 | Li | A61B 6/032 378/19 |
| 2013/0306875 | A1 * | 11/2013 | Wei | G01T 1/2018 250/366 |
| 2013/0321685 | A1 * | 12/2013 | Ahn | H04N 5/374 348/308 |
| 2014/0270057 | A1 | 9/2014 | Bartolome et al. | |
| 2014/0284752 | A1 * | 9/2014 | Kalliopuska | H01L 27/14661 257/448 |
| 2015/0288908 | A1 | 10/2015 | Shen | |
| 2016/0118424 | A1 * | 4/2016 | Guidash | H01L 27/14614 |

FOREIGN PATENT DOCUMENTS

| | | |
|---|---|---|
| GB | 2451447 A | 2/2009 |
| WO | 2012138345 A1 | 10/2012 |
| WO | 2013050229 A1 | 4/2013 |
| WO | 2014072939 A1 | 5/2014 |
| WO | 2015199612 A1 | 12/2015 |

OTHER PUBLICATIONS

International Search Report and Written Opinion for corresponding PCT application No. PCT/US2016/055543 dated Feb. 15, 2017; 18 pages.

Fornaini, Alessandro, et al.; "A tiled array of hybrid pixel detectors for X-ray imaging", Nuclear Science, IEEE Transactions on, vol. 51, Issue 4, pp. 1824-1828, Aug. 2004.

"Exxim's Fluoroscopy CMOS Detector Applications", Exxim Computing Corporation, http://www.exxim-cc.com/technology_xraysensors.htm, 2006, retrieved on Sep. 29, 2015.

Tamaki, Mitsuru, et al.; "Development of 4-Sides Buttable CdTe-ASIC Hybrid Module for X-ray Flat Panel Detector", IEEE Transactions on Nuclear Science, vol. 56, Issue 4, pp. 1-4, Aug. 2009.

Tran, Nang T.; "A Four-Side-Buttable Tiling Scheme for a Near Real-Time Digital Radiography Detector for Medical Applications", The Third Solid State Systems Symposium—VLSI and Semiconductor Related Technologies, 11 pages, 2014.

Biju Jacob et al., filed Dec. 31, 2015, U.S. Appl. No. 14/985,785.
Jianjun Guo et al., filed Jun. 25, 2015, U.S. Appl. No. 14/750,067.
Ibrahim Issoufou Kouada et al., filed Oct. 27, 2015, U.S. Appl. No. 14/923,812.

Rowlands et al., "Low Cost Digital Radiographic Imaging Systems: The X-ray Light Valve", Medical Imaging 2006: Physics of Medical Imaging, vol. No. 6142, pp. 614203-1-614203-9, 2006.

Limousin et al., "Caliste 256: A CdTe Imaging Spectrometer for Space Science with a 580 μm Pixel Pitch", Nuclear Instruments and Methods in Physics Research Section A, vol. No. 647, pp. 46-54, May 17, 2011.

Batignani et al., "3D Integration of Advanced Pixel Detectors and Readout Electronics", Valerio Re—WE Heraeus Seminar—Bad Honnef, pp. 1-48, May 23, 2013.

(56) References Cited

OTHER PUBLICATIONS

Henry et al., "TSV Last for Hybrid Pixel Detectors: Application to Particle Physics and Imaging Experiments", Electronic Components and Technology Conference (ECTC), IEEE Xplore, pp. 568-575, May 28-31, 2013.
Deptuch et al., "Design and Tests of the VerticaNy Integrated Photon Imaging Chip", IEEE Transactions on Nuclear Science, vol. No. 61, Issue No. 1, pp. 663-674, Feb. 2014.
"PixFEL EnablingTechnologies, Building Blocks and Architectures for Advanced X-ray Pixel Cameras at FELs", pp. 1-26, 2014.
Ratti, "The PixFEL Project: Developing a Fine Pitch, Fast 2D X-ray Imager for the Next Generation X-FELs", 10th International Conference on Radiation Effects on Semiconductor Materials, Detectors and Devices (RESMDD14), pp. 1-41, Oct. 8-10, 2014, Florence, Italy.
U.S. Notice of Allowance issued in connection with related U.S. Appl. No. 14/923,812 dated Jul. 5, 2016.
U.S. Notice of Allowance issued in connection with related U.S. Appl. No. 14/750,067 dated Oct. 11, 2016.
International Search Report and Written Opinion issued in connection with related PCT Application No. PCT/US2016/053029 dated Dec. 2, 2016.
PCT Invitation to Pay Additional Fees issued in connection with related PCT Application No. PCT/US2016/055555 dated Feb. 22, 2017.

* cited by examiner

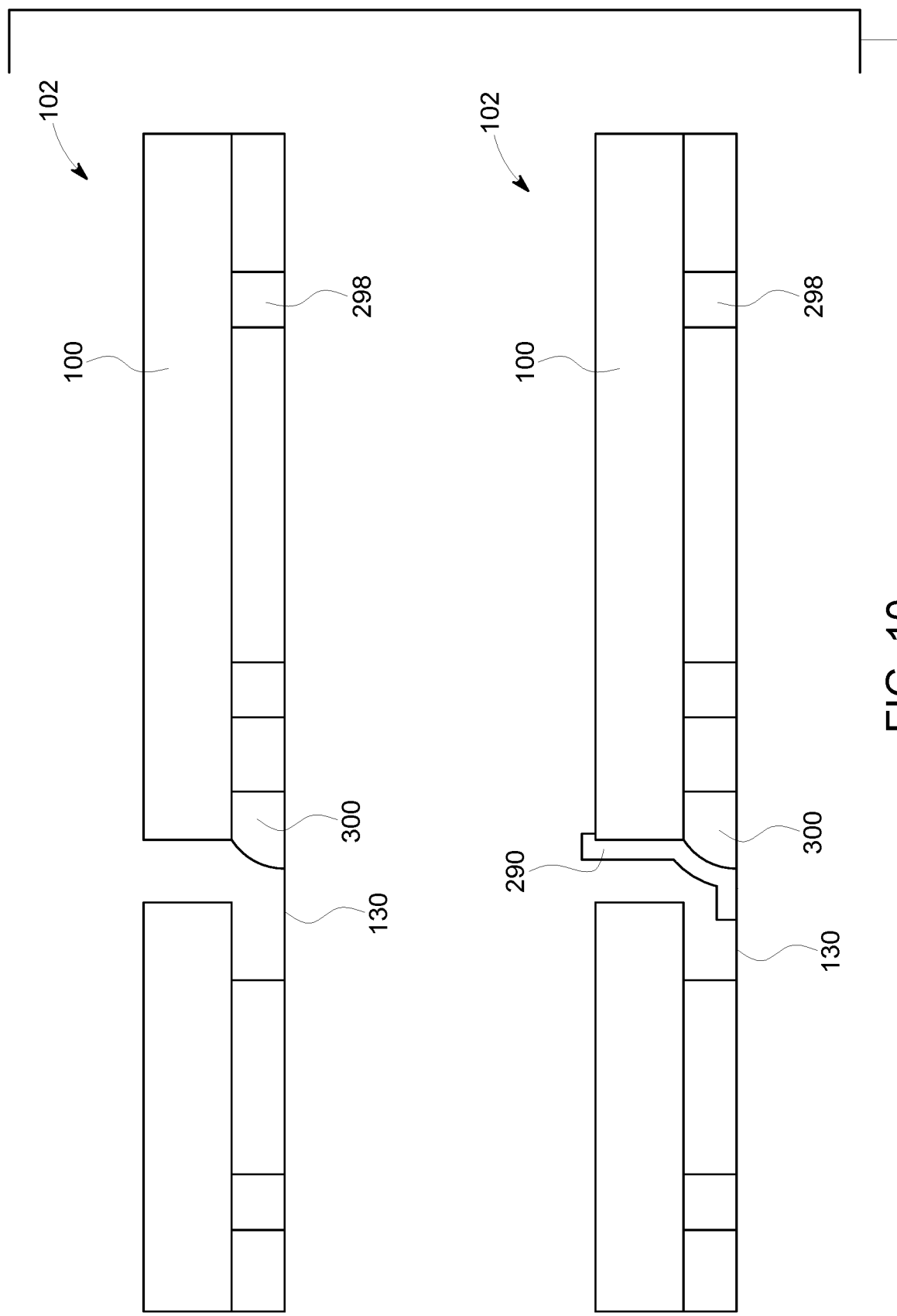

RADIATION DETECTOR ASSEMBLY

BACKGROUND

The subject matter disclosed herein relates to the fabrication and use of radiation detectors, including X-ray radiation detectors composed of arrays of CMOS tiles.

Non-invasive imaging technologies allow images of the internal structures or features of a subject (patient, manufactured good, baggage, package, or passenger) to be obtained non-invasively. In particular, such non-invasive imaging technologies rely on various physical principles, such as the differential transmission of X-rays through the target volume or the reflection of acoustic waves, to acquire data and to construct images or otherwise represent the internal features of the subject.

By way of example, digital X-ray imaging systems are used to generate digital data in a non-invasive manner and to reconstruct such digital data into useful radiographic images. In current digital X-ray imaging systems, radiation from a source is directed toward a subject or object, typically a patient in a medical diagnostic application, a package or baggage in a security screening application, or a fabricated component in an industrial quality control or inspection application. A portion of the radiation passes through the subject or object and impacts a detector. The scintillator of the detector converts the higher-energy X-ray radiation to lower-energy light photons that are sensed using photosensitive components (e.g., photodiodes or other suitable photodetectors). The detector is typically divided into a matrix of discrete picture elements or pixels, and encodes output signals based upon the quantity or intensity of the radiation impacting each pixel region. The signals may then be processed to generate an image that may be displayed for review.

The detector features may be based on or formed from a silicon semiconductor substrate. Such a silicon substrate may be provided as crystalline silicon (c-Si), which consists of an ordered silicon matrix (e.g., a well ordered crystal lattice), or amorphous silicon (a-Si), which does not have an ordered matrix (e.g., a random crystal lattice). The random crystal lattice of a-Si typically provides a much lower electron mobility than that provided by an ordered crystal lattice of c-Si (e.g., <1 cm$^2$/(v·s) compared to approximately 1,400 cm$^2$/(v·s)). Despite this, the mainstream technology for fabricating X-ray panels for medical and industrial inspection utilizes amorphous silicon TFTs due to their competitive cost and large area capability. In particular, X-ray panels for medical and industrial inspection often require large area image sensors, typically ranging from 20 cm×20 cm to 40 cm×40 cm and more, and such large sensors can typically be made using a-Si technology more readily than using c-Si technology.

However, in some applications there is a growing need to build panels with higher resolution and lower electronic noise than may be achievable with a-Si technology. Because of the higher electron mobility associated with c-Si the size of features that can be formed using c-Si can be much smaller than those formed from the a-Si. Thus, X-ray detectors based on c-Si technology, such as those employing complementary metal-oxide-semiconductors (CMOS) formed from c-Si, may outperform traditional a-Si based X-ray detector in various ways. However, disadvantages of using c-Si include: higher cost and smaller panel size due to limitations in the practical size of silicon wafers used to fabricate c-Si devices. Such wafer size limitations may require tiling multiple, smaller panels together to form a detector panel of useful size. However, such tiling arrangements introduce complexities in the electrical interconnection arrangements needed to operate (e.g., readout) such a detector panel and may be difficult or impractical to implement in practice.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible embodiments. Indeed, the invention may encompass a variety of forms that may be similar to or different from the embodiments set forth below.

In one implementation, a radiation detector is provided. The radiation detector includes a substrate having a plurality of conductive traces. The radiation detector also includes a tiled array of complementary metal-oxide-semiconductor (CMOS) tiles, each having a plurality of vias provided as electrical contacts. Each via is in electrical communication with a respective conductive trace on the substrate.

In a further implementation, a method of fabricating a radiation detector is provided. In accordance with this method, a plurality of complementary metal-oxide-semiconductor (CMOS) tiles are positioned on a substrate such that a portion of the CMOS tiles abut other CMOS tiles on four sides. A plurality of vias formed in the CMOS tiles are aligned and electrically connected with respective conductive traces present on the substrate such that each via is in electrical contact with at least one conductive trace of a plurality of conductive traces on the substrate.

In an additional implementation, a radiation detector is provided. The radiation detector includes a substrate and a tiled array of complementary metal-oxide-semiconductor (CMOS) tiles positioned on the substrate. Each CMOS tile has a plurality of conductive traces formed on a metalized top layer of the respective CMOS tile and at least one contact pad formed on at least one end of each conductive trace. The radiation detector also includes a plurality of conductive bridges formed between corresponding contact pads of adjacent CMOS tiles.

In a further implementation, a method of fabricating a radiation detector is provided. In accordance with this method a plurality of complementary metal-oxide-semiconductor (CMOS) tiles are positioned on a substrate such that a portion of the CMOS tiles abut other CMOS tiles on four sides. A respective conductive bridge is formed between adjacent contacts pads formed on metalized top layers of adjacent CMOS tiles to form electrical connections on the top of the plurality of CMOS tiles.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 10 depicts fabrication steps for forming an interconnect structure along a vertical sidewall of a CMOS tile, in accordance with aspects of the present disclosure.

DETAILED DESCRIPTION

Figure 1:
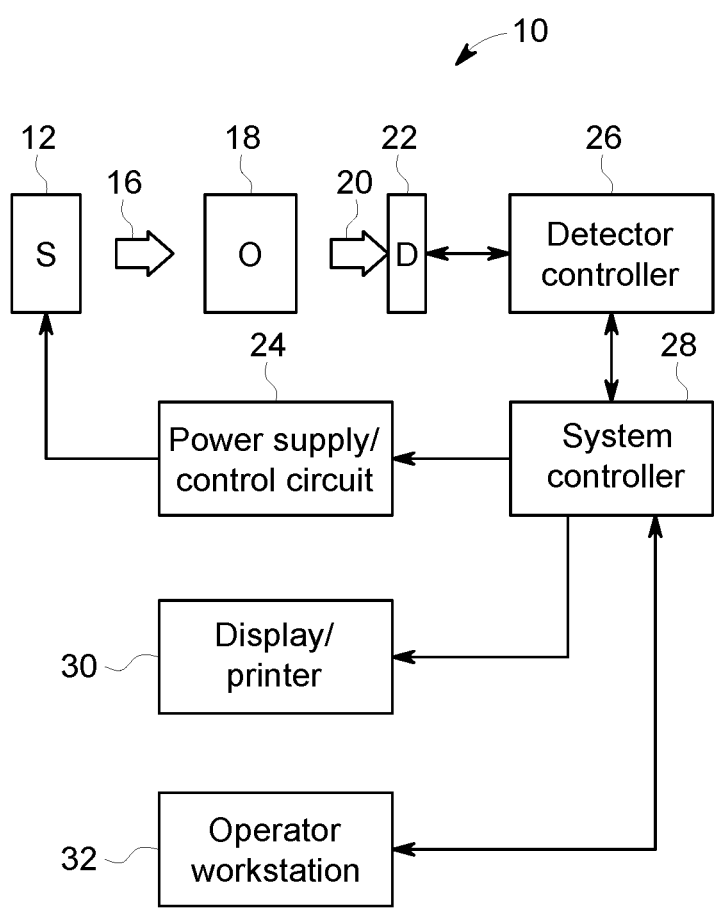
FIG. 1 depicts a block-diagram of an embodiment of a digital X-ray imaging system, in accordance with aspects of the present disclosure.

One or more specific implementations will be described below. In an effort to provide a concise description of these implementations, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure While the following discussion is generally provided in the context of medical imaging, it should be appreciated that the present techniques are not limited to such medical contexts. Indeed, any examples and explanations provided in such a medical context is only to facilitate explanation by providing instances of real-world implementations and applications. However, the present approaches may also be utilized in other contexts, such as the non-destructive inspection of manufactured parts or goods (i.e., quality control or quality review applications), and/or the non-invasive inspection of packages, boxes, luggage, and so forth (i.e., security or screening applications).

X-ray panels for medical and industrial inspection often require large area panels ranging from 20 cm×20 cm to 40 cm×40 cm or more. Conventionally such large area panels are made using amorphous silicon (a-Si) technology, despite the limitations associated with a-Si. However, in some applications there is a need for imager panels with higher resolution and lower electronic noise than may be achievable with a-Si technology. In particular, X-ray detectors based on c-Si technology, such as those employing complementary metal-oxide-semiconductors (CMOS) formed from c-Si, may outperform traditional a-Si based X-ray detectors in various ways. However, traditional disadvantages of using c-Si include higher cost and smaller panel size due to limitations in the practical size of silicon wafers used to fabricate c-Si devices. Such wafer size limitations may require tiling multiple, smaller panels together to form a detector panel of useful size. However, such tiling arrangements introduce complexities in the electrical interconnection arrangements needed to operate (e.g., readout) such a detector panel and may be difficult or impractical to implement in practice.

As discussed herein, approaches are discussed for overcoming the limitations typically associated with c-Si fabrication techniques to form large area sensors by tiling together smaller imagers. By way of example, approaches employing CMOS technology are described that address these needs. CMOS imagers are built from CMOS wafers, with the common formats available being 8 inch and 12 inch diameters. Current approaches build large (~10 cm×14 cm) 3-side buttable imagers (i.e., three-sides may abut adjacent imager tiles while one-side provides an electrical connection interface) from these wafers and tile these individual imagers to build the larger X-ray panels. However, due to providing one side as an interface, this approach is limited to panels up to 30 cm×30 cm (when using from 8 inch wafers) and is relatively more expensive than using a-Si panels due to the challenges in yielding large area CMOS imagers in sufficient quantities and qualities.

With this in mind, the present approaches use smaller (e.g. 2.5 cm to 5 cm on a side) four-side buttable CMOS tiles (i.e., imagers), which may be arranged to build panels of any size (and shape) that is desired. Smaller size imagers also have improved yields and this potentially lowers the panel cost. However one challenge of implementing this approach is the assembly of a large number of tiles reliably and precisely to meet the stringent requirements of the medical and inspection needs. As discussed herein, several methods are provided to solve the assembly problem.

Therefore, as discussed herein, different methods for assembling large area X-ray panels using four-side buttable digital CMOS tiles are provided. By way of example, one method of assembly applicable for CMOS tiles is with through-silicon-vias (TSVs) which allow electrical connections to be made on the back of each tile. In addition, other techniques are described that allow interconnection of CMOS tiles through contact structures formed on the front of the CMOS tiles. CMOS-based detectors as described herein may be front-lit when in use (i.e., with X-rays configured to impact the scintillator layer initially), although some of the techniques are also applicable to back-lit imagers (in which the X-rays pass through the light imager panel prior to impacting the scintillator). In certain implementations, readout electronics may integrated with each CMOS tile, such that data is read out and converted to digital signals at the tile-level, and signal acquired from each tile is in the form of digital signals, typically representative of groups of pixels on a given tile.

With the preceding in mind, and turning now to the drawings, FIG. 1 illustrates diagrammatically an imaging system 10 for acquiring and processing image data using a detector fabricated as discussed herein. In the illustrated embodiment, system 10 is a digital X-ray system designed both to acquire original image data and to process the image data for display. The imaging system 10 may be a stationary or mobile X-ray system. In the embodiment illustrated in FIG. 1, imaging system 10 includes a source of X-ray radiation 12 that emits a stream of radiation 16 into a region in which an object or subject 18 is positioned. A portion of the radiation 20 passes through or around the subject and impacts a digital X-ray detector, represented generally at reference numeral 22. The detector 22 may be portable or permanently mounted to the system 10. In certain embodiments, the detector 22 may convert the incident X-ray photons to lower energy photons which are detected. Electrical signals are generated in response to the detected photons and these signals are processed to reconstruct an image of the features within the object or subject.

As discussed herein, the detector array 22 may be formed from a plurality of tiled CMOS imagers, each separately defining an array of detector elements (e.g., pixels). Each detector element produces an electrical signal that represents the intensity of the X-ray beam incident at the position of the detector element when the beam strikes the detector 22. In one embodiment, each tiled imager includes separate readout electronics configured for reading out pixels on the respective CMOS tile and providing separate respective digital outputs corresponding to groups of pixels on the tile. That is, readout occurs at two separate levels of abstraction, with pixel readout occurring at each tile and tile readout occurring at the detector level. Digital signals representative of groups of pixels on each respective tile are acquired and processed to generate one or more scan datasets.

Source 12 is controlled by a power supply/control circuit 24 which furnishes both power and control signals for examination sequences. Moreover, detector 22 includes a detector controller 26 (e.g., control circuitry) which commands acquisition of the signals generated in the detector 22. Detector controller 26 may also execute various signal processing and filtration functions, such as for initial adjustment of dynamic ranges, interleaving of digital image data, and so forth. Both power supply/control circuit 24 and detector controller 26 are responsive to signals from a system controller 28. In general, system controller 28 commands operation of the imaging system to execute examination protocols and to process acquired image data. In the present context, system controller 28 may also include signal processing circuitry and one or more data storage structures, such as optical memory devices, magnetic memory devices, or solid-state memory devices, for storing programs and routines executed by a processor of the system 10 to carry out various functionalities. In one embodiment, a programmed computer system may be provided with hardware, circuitry, firmware, and/or software for performing the functions attributed to one or more of the power supply/control circuit 24, the detector controller 26, and/or the system controller 28.

In the embodiment illustrated in FIG. 1, system controller 28 is linked to at least one output device, such as a display or printer as indicated at reference numeral 30. The output device may include standard or special purpose monitors and associated processing circuitry. One or more operator workstations 32 may be further linked in the system for outputting system parameters, requesting examinations, viewing images, and so forth. In general, displays, printers, workstations, and similar devices supplied within the system may be local to the data acquisition components, or may be remote from these components, such as elsewhere within an institution or hospital, or in an entirely different location, linked to the image acquisition system via one or more configurable networks, such as the Internet, virtual private networks, cloud-based network, and so forth.

To facilitate and simplify explanation, only certain of the components that may be present in an imaging system 10 are described. Other components or functionalities may be present however. By way of example, structural components, such as a gantry or C-arm, may be present on which one or both of the source 12 or detector 22 may be mounted. Such mounting structures may allow data to be acquired over an angular range during an examination, such as in the case of a computed tomography (CT), tomosynthesis, or C-arm angiography system. Similarly, various rotational positioning subsystems (such as for control rotation of the source 12 and detector 22) and/or linear positioning subsystems (such as for linearly translating the objet or patient 18 during an examination) may also be present, in practice, the imaging system 10 may be any suitable X-ray based imaging system, including, but not limited to, conventional radiography systems, CT imaging systems, tomosynthesis systems, C-arm systems, fluoroscopy systems, mammography systems, dual- or multiple-energy systems, navigational or interventional imaging systems, and so forth.

Keeping in mind the operation of the system 10 and, specifically, the detector 22 discussed above with respect to FIG. 1, the present approaches provide for the fabrication of detector panel assemblies from CMOS imager tiles that may abut other CMOS imager tiles on all four-sides within a two-dimensional plane (i.e., the plane of the tile). In certain such implementations, the data and control interconnections to each tile may be provided above or below the plane of the tile, where the plane is understood to correspond to the long dimensions of the tile (e.g., 2.5 cm×2.5 cm, 5 cm×5 cm, and so forth).

Figure 2:
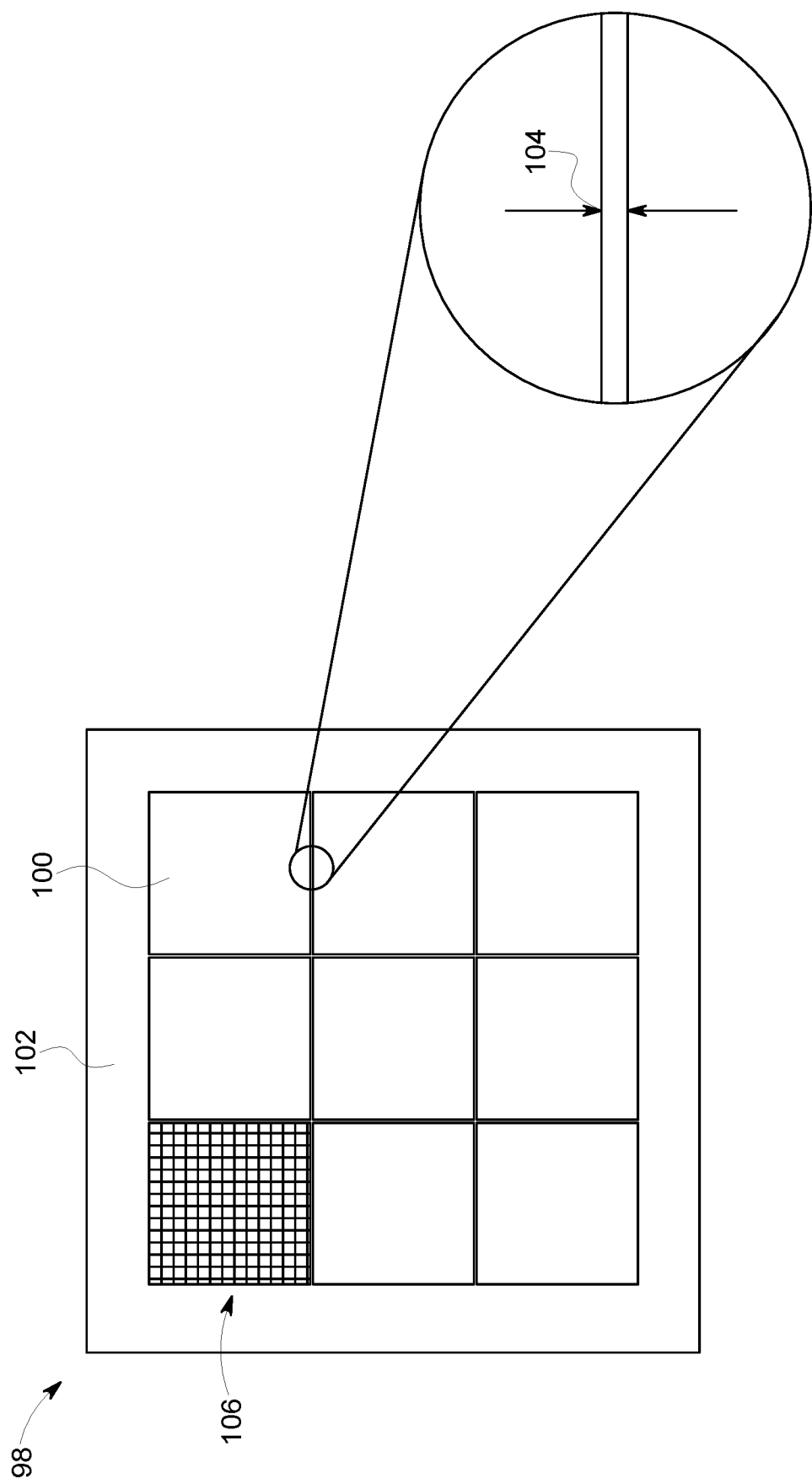
FIG. 2 depicts the use of four-side buttable CMOS tiles in the fabrication of a detector panel, in accordance with aspects of the present disclosure.

Turning to FIG. 2, an example for assembling four-side buttable CMOS tiles to form a large area detector panel 98 is shown. In this example, four-side buttable CMOS tiles 100, each including an array of pixels 106 (shown only in the right uppermost tile 100 to simplify presentation), is shown positioned on a substrate 102 (e.g., a glass, ceramic, or other thermally compatible material). As noted above, readout electronics including analog-to-digital signal conversion circuitry may be provided on each CMOS tile 100, such that the output signals acquired from each tile are digital signals corresponding to pixel outputs on the respective CMOS tile 100.

In a detector panel 22, there may be any suitable number of tiles 100, such 3×3, 4×4, 8×8, or more CMOS tiles 100. CMOS tiles 100 may, in certain implementations, be 2.5 cm×2.5 cm, 5 cm×5 cm, and so forth, in the dimensions defining the plane of the tile and may be 500 µm to 700 µm thick. By way of example, each CMOS tile 100 may measure 500 pixels×500 pixels, with each pixel 106 in turn measuring 50 µm×50 µm.

The CMOS tiles 100 are oriented and spaced precisely, such as using automated or machine placement, based on the image quality requirements of the application for which the detector 22 will be used. Typically the spacing and orientation of the tiles 100 will also be determined so that the geometry stays stable during the thermal life-cycle of the panel, e.g., a light imager panel of the detector 22. Typically the physical spacing between the adjacent tiles 100 is controlled so that the butting gap 104 is less than a pixel pitch across, i.e., approximately 1 line of data, and in one implementation is 50 µm or less. In this manner, less than one line of data is lost due to the presence of the gap 104.

Figure 3:
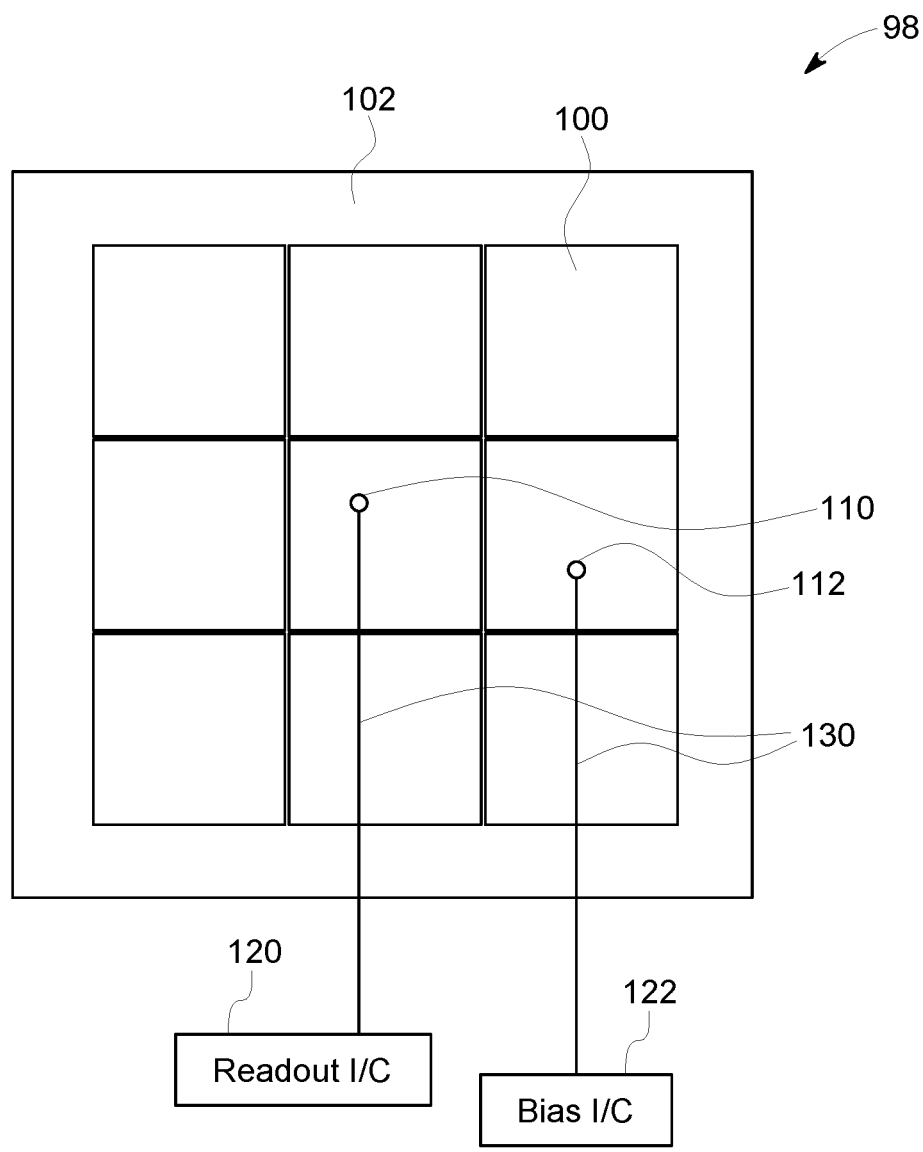
FIG. 3 depicts the tiled detector assembly of FIG. 2 with related readout and bias circuitry, in accordance with aspects of the present disclosure.

With this in mind, and turning to FIG. 3, electrical connections of the panel 98 or panel portion illustrated in FIG. 2 is illustrated. The electrical connections to the panel consist of both digital input/output (I/O) and also analog bias/control lines. The digital signal pads 110 and analog signal pads 112 on the imagers (i.e., CMOS tiles 100) are connected, respectively, to external readout integrated circuits 120 (which may apply voltage and ground signal) and bias integrated circuits 122 (which may apply analog bias signals) using interconnect traces 130. As discussed herein, four assembly approaches for electrical connecting and reading out the CMOS tiles 100 are described: (1) through-silicon-vias (TSVs); (2) tile-to-tile interconnects; (3) interconnect on thin transparent sheet; and (4) 3D printed interconnects.

Figure 4:
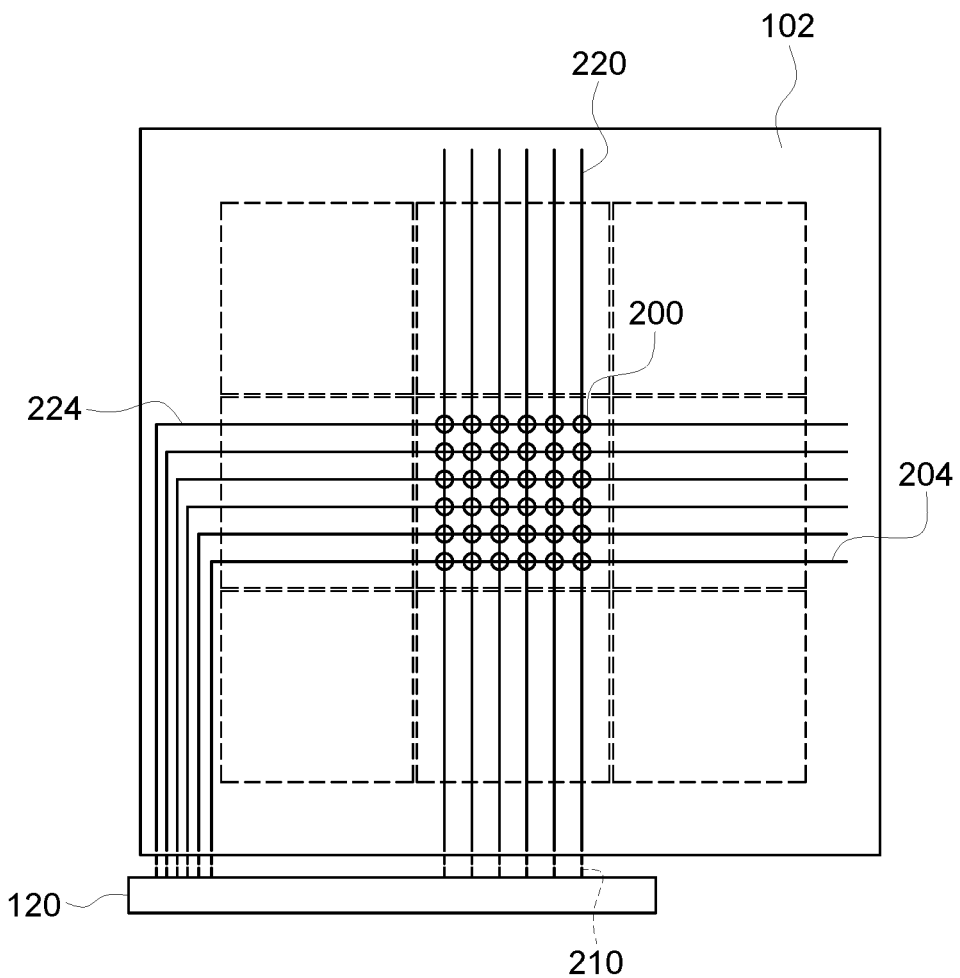
FIG. 4 depicts the use of four-side buttable CMOS tiles in the fabrication of a detector panel using through-silicon-vias, in accordance with aspects of the present disclosure.

Referring to FIG. 4, interconnection using through-silicon-vias (TSVs) 200 is illustrated. In this implementation, the CMOS tiles 100 are formed with the vias 200 formed therein, or vias 200 are formed in fabricated tiles 100. As will be appreciated, each via 200 is essentially a metalized column or pillar passing through all or part of the thickness of a respective CMOS tile 100 so as to allow electrical interconnection of different layers within the tile 100 and corresponding passage of electrical signals along the via 200. In certain implementations, each via 200 electrically interconnects, and allows the readout of, a multitude of pixels (e.g., 250, 500, 1,000, and so forth) on the CMOS tile 100. The vias 200 open on to the back side (i.e., the substrate facing side) of the tiles 100, which are attached to the substrate 102.

The substrate 102 (glass, ceramic or other thermally compatible material) has metal traces 204 (e.g., digital output lines 220 and enable lines 224) incorporated on its surface. As discussed herein, the digital output lines 220 and enable lines 224 generally connect to contact structures on the CMOS tiles 100 (such as vias 200) through which sub-arrays of pixels on the respective tile may be selected or enabled and the digital data for the sub-array read out. The vias 200 are conductively attached to these metal traces 204 using conventional techniques. The I/O readout IC 120 and other bias ICs 122 can be either attached directly on the substrate 120 or can be external to the substrate 102 and electrically connected using electrical interconnect structures 210, such as wires, flex circuits and so forth.

In the depicted example, a 3×3 tile arrangement is shown, with only the interconnection of the central CMOS tile 100 shown to simplify explanation. In the depicted example, digital output lines 220 are shown running vertically and enable lines 224 are shown running horizontally. Because of the readout circuitry integrated with each CMOS tile 100, the tile readout circuitry provides a first level of readout corresponding to a portion (e.g., sub-array) of the pixels of a respective tile 100, while the depicted interconnect circuitry provides a second level of readout corresponding to the tiles 100. That is, integrated readout circuitry on the tiles 100 read out pixels on the tiles, while readout circuitry external to the tiles 100 reads out the tiles 100 forming the detector panel 22.

In one example of the TSV readout implementation, each CMOS tile 100 contains 25,000 pixels and is interconnected using 200-300 vias, or approximately 1,000 pixels per via 200. Each via 200 can be read out like a pixel, but aggregates the data for those pixels linked to the respective via 200. That is, each via 200 essentially corresponds to a sub-array of pixels, such as a sub-array of 250, 500, or 1,000 pixels. In one implementation, the digital output lines 220 for reading out vias 200 may be spaced apart approximately 2 mm, as opposed to the more typical 100 µm spacing of data lines for reading out pixels separately. In this manner, pixel readout occurs at the tile level, and tile readout occurs at the detector level.

Figure 5:
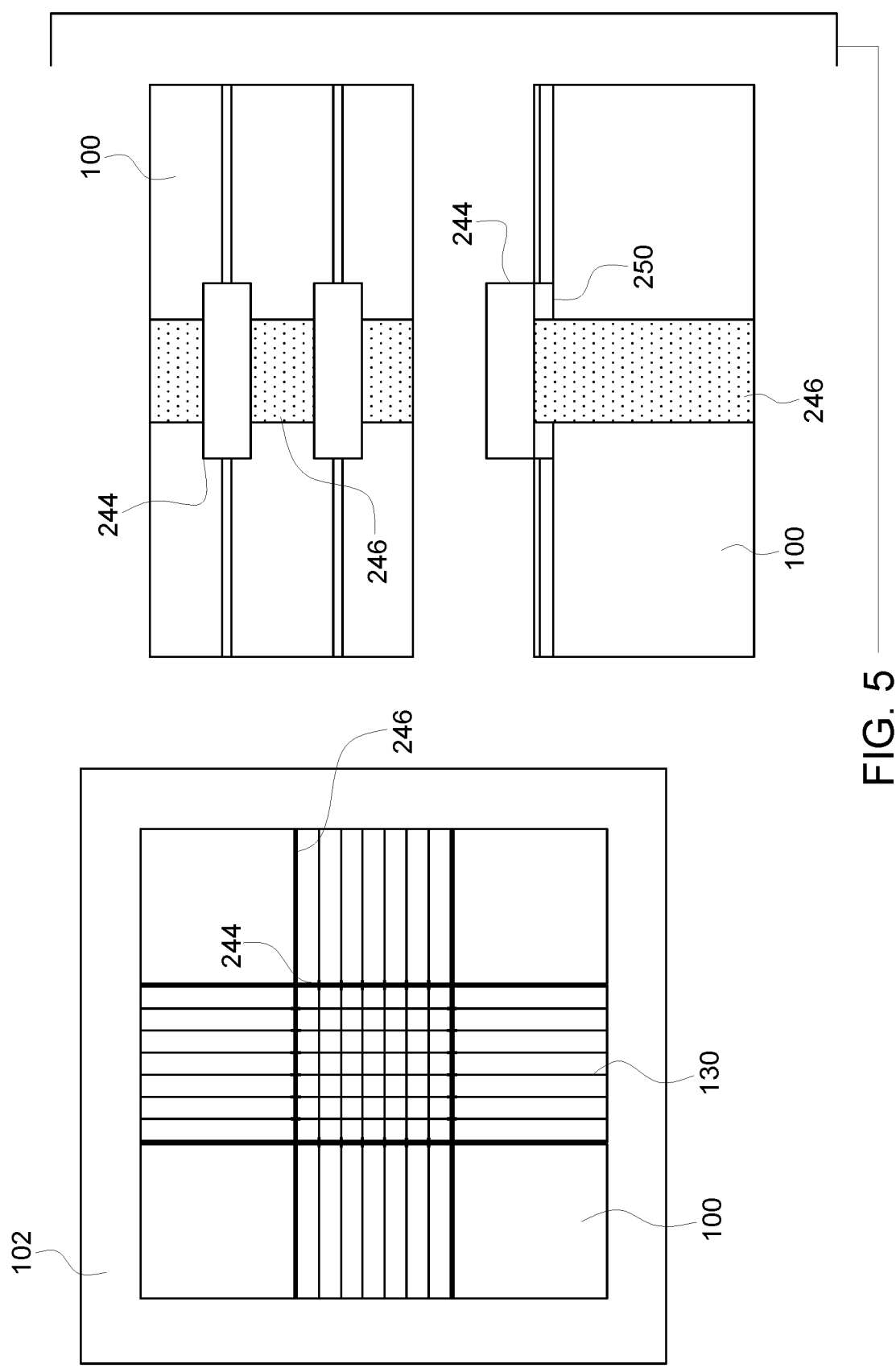
FIG. 5 depicts the use of four-side buttable CMOS tiles in the fabrication of a detector panel using top-surface tile-to-tile interconnects, in accordance with aspects of the present disclosure.

While use of TSVs is one approach for electrically interconnecting CMOS tiles 100, it involves forming interconnections on the back of the tiles 100, which may incur additional manufacturing costs and complexity. Turning to FIG. 5, a plan view (left), close-up top view (right top) and corresponding close-up side view (right bottom) are illustrated for a tile-to-tile interconnection approach that avoids interconnections formed on the backs of the CMOS tiles 100. Here the metal traces 240 (e.g., digital output lines and enable lines) are part of the top (i.e., X-ray facing) metal layer of the CMOS tiles 100, and electrical connection of traces 240 for tile readout is by electrical connection to adjacent CMOS tiles 100 by a conductive bridge interconnect 244. In one implementation, prior to the formation of the bridge trace 244, a filler material 246 is applied to fill the butting gap 104. As shown in FIG. 5, bridges 244 may be formed so as to electrically connect metal pads 250 formed on the CMOS tiles 100 where the conductive (e.g., metal) traces 130 formed on each CMOs tile 100 electrically connect to the tiles 100. At the edges of the detector panel 22, the interconnects 130 may be bridged and electrically connected to a motherboard or other primary data readout circuitry.

As with the vias 200, each bridge 244 effectively connects data readout for multiple pixels, e.g., sub-arrays of 250, 500, 1,000 pixels, and so forth, such that pixel readout effectively occurs at the tile level (via integrated readout electronics which output digital signals) and then readout via conductive (e.g., metal) traces 130 corresponds to the data from the grouped or sub-arrays of pixels. As with the TSV approach described above, the resulting CMOS tiles 100 when so interconnected are still four-side buttable, and may be assembled to form large-area detectors or different shapes of detectors.

Figure 6:
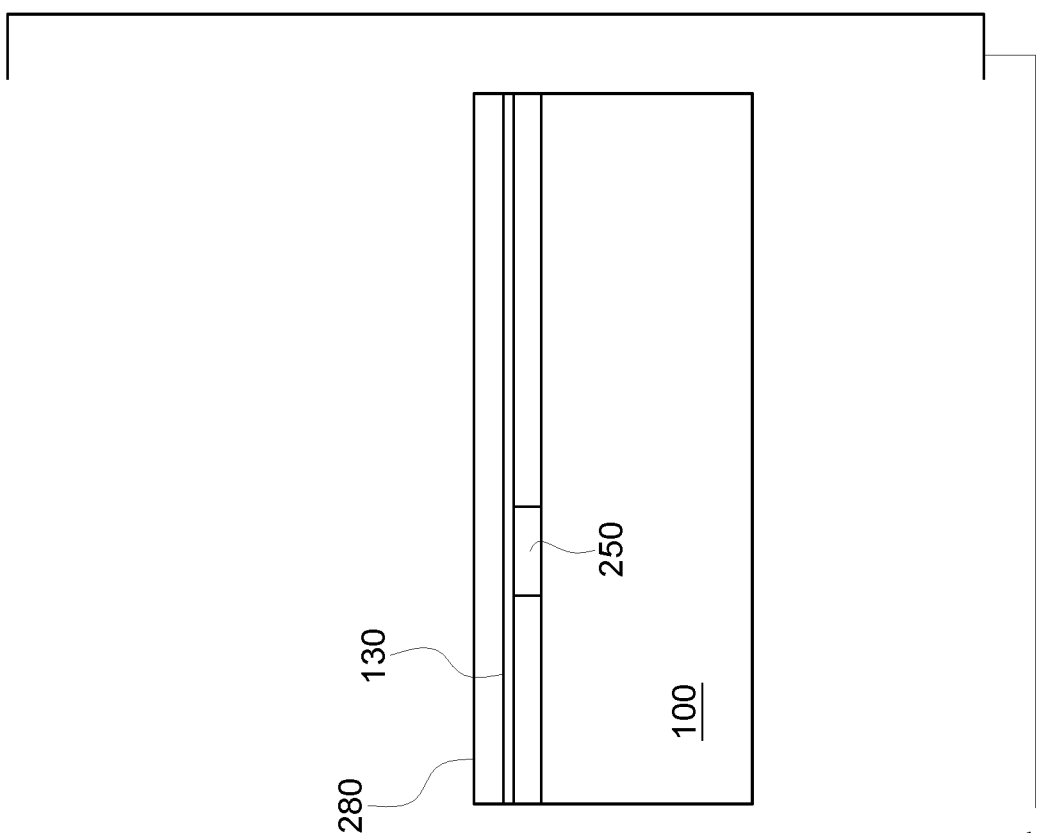
FIG. 6 depicts the use of four-side buttable CMOS tiles in the fabrication of a detector panel using a transparent top layer having interconnect lines formed therein, in accordance with aspects of the present disclosure.
Figure 6:
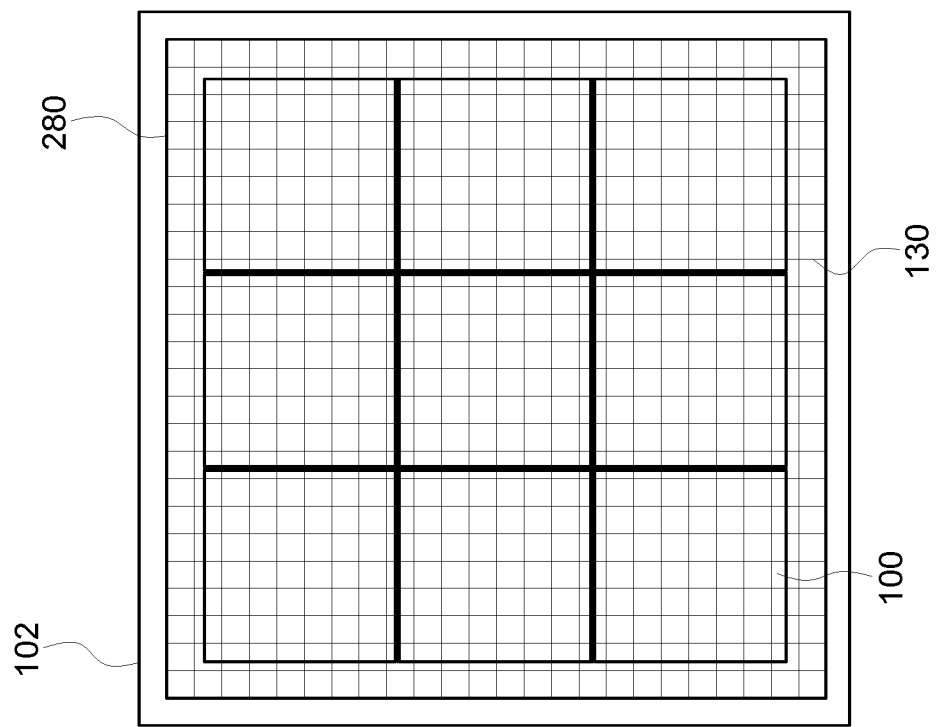

Turning to FIG. 6, another implementations is described in which the interconnections are provided on the front of the CMOS tiles 100. Unlike the preceding implementation, however, the conductive (e.g., metal) traces 130 are not formed in the metalized layer of the CMOS tiles 100, but in a separate, optically transparent sheet 280 positioned over the CMOS tiles 100 (i.e., opposite the substrate 102, such as between the CMOS tiles 100 and a deposited scintillator material 282). The transparent sheet may be fabricated from, by way of example, thin glass (e.g., a 30 µm-50 µm glass sheet) or fiber optic plate. In particular, the conductive traces 130 (e.g., digital output lines and enable lines) present in the transparent sheet 280, when positioned, connect pads 250 formed in or on the CMOS tiles 100 such that, when properly positioned, the traces 130 within the sheet 280 run between, and electrically connect pads 250 on the tiles 100.

As in the preceding examples, the pads 250, and interconnecting traces 130, may be associated with sub-arrays of pixels (e.g., 250, 500, 1,000, and so forth) on the respective tiles 100 such that operation of a trace 130 allows readout or operation of a multitude of pixels. Thus, pixel readout effectively occurs at the tile level (via integrated readout electronics which output digital signals) and then readout via conductive (e.g., metal) traces 130 corresponds to the data from the grouped or sub-arrays of pixels. As with the TSV approach described above, the resulting CMOS tiles 100 when so interconnected are still four-side buttable, and may be assembled to form large-area detectors or different shapes of detectors 22.

In terms of fabrication, in one implementation the CMOS tiles may be assembled "upside down" on the transparent sheet 280 such that the metal layer side of the CMOS tiles 100 is positioned on the side of the transparent sheet 280 on which the conductive (e.g., metal) traces 130 are present. In such an implementation, the transparent sheet 280 performs two functions: (1) providing a uniform flat surface for tiling of the CMOS tiles 100, and (2) providing an interconnect layer electrically connecting the CMOS tiles 100.

Figure 7:
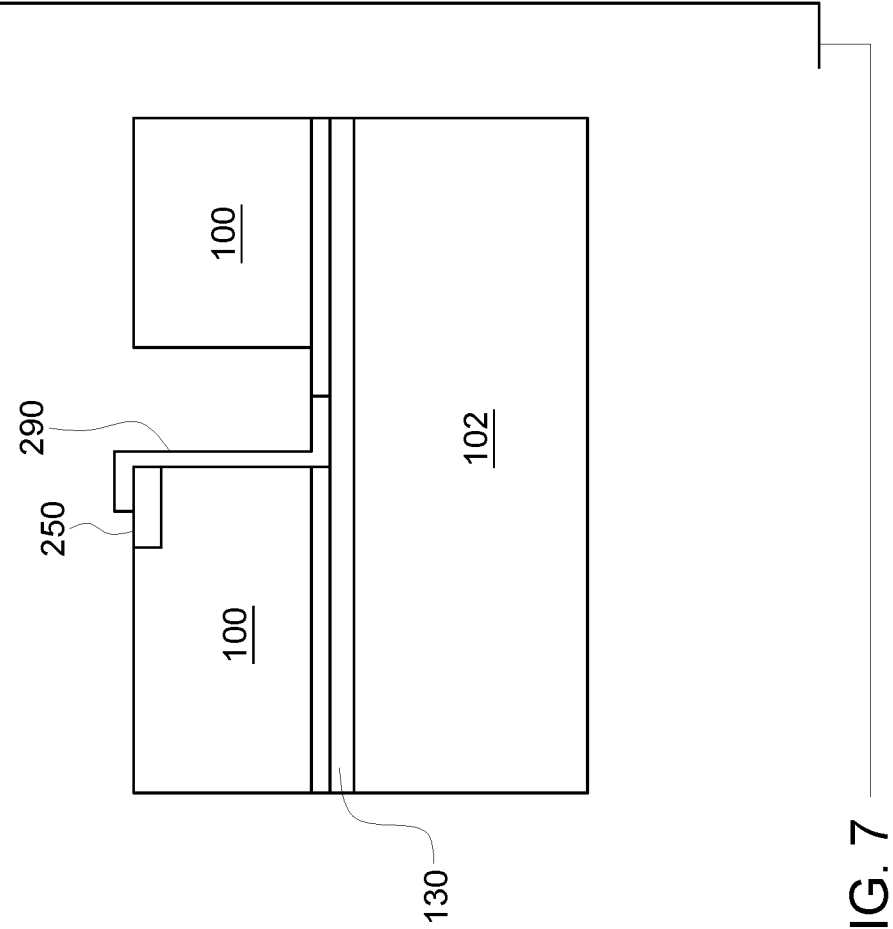
FIG. 7 depicts the use of four-side buttable CMOS tiles in the fabrication of a detector panel using conductive structures formed on the vertical sidewalls of the CMOS tiles, in accordance with aspects of the present disclosure.
Figure 7:
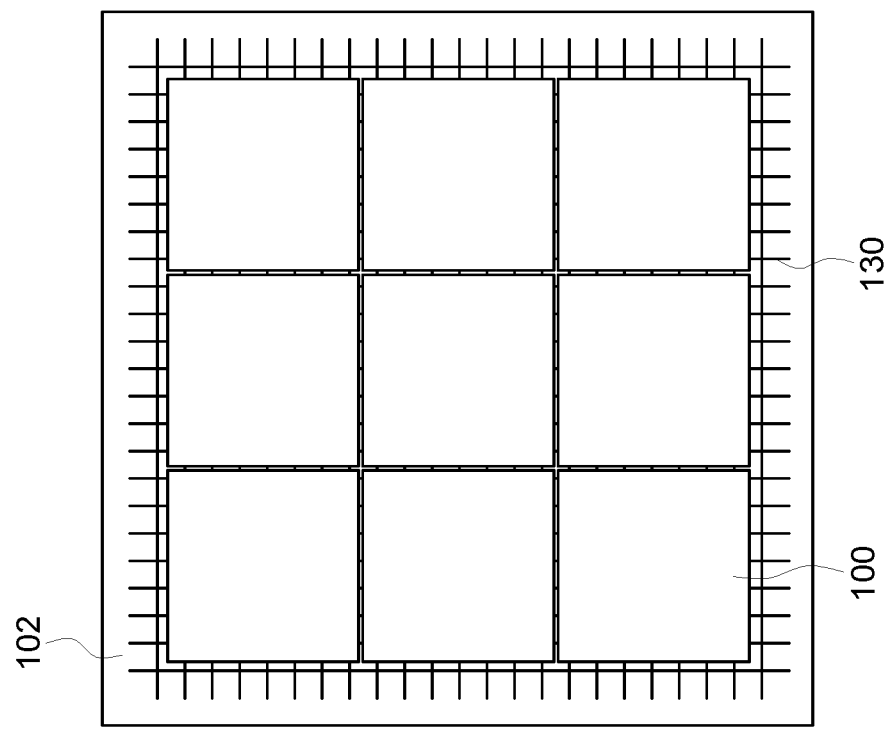

In an alternative implementation, shown in FIG. 7, the metallic pads 250 for forming electrical connections to CMOS tiles 100 are formed on the tops of the CMOS tiles 100, as in the two preceding examples. However the conductive (e.g., metal) traces 130 (e.g., digital output lines and enable lines) are formed beneath the CMOS tiles 100 on the substrate 102. In this implementation, conductive structures (e.g., metal traces) 290 may be formed external to each CMOS tile 100 along the vertical side walls so as to connect the electrical pads 250 on the tops of the CMOS tiles to corresponding traces 130 on the top of the substrate 102. In certain implementations, the conductive structures may be formed using additive manufacturing techniques (e.g., 3D printing techniques).

As in the preceding examples, the pads 250, and interconnecting traces 130, may be associated with sub-arrays of pixels (e.g., 250, 500, 1,000, and so forth) on the respective tiles 100 such that operation of a trace 130 allows readout or operation of a multitude of pixels. Thus, pixel readout effectively occurs at the tile level (via integrated readout electronics which output digital signals) and then readout via conductive (e.g., metal) traces 130 corresponds to the data from the grouped or sub-arrays of pixels. As with the TSV approach described above, the resulting CMOS tiles 100 when so interconnected are still four-side buttable, and may be assembled to form large-area detectors or different shapes of detectors 22.

Figure 8:
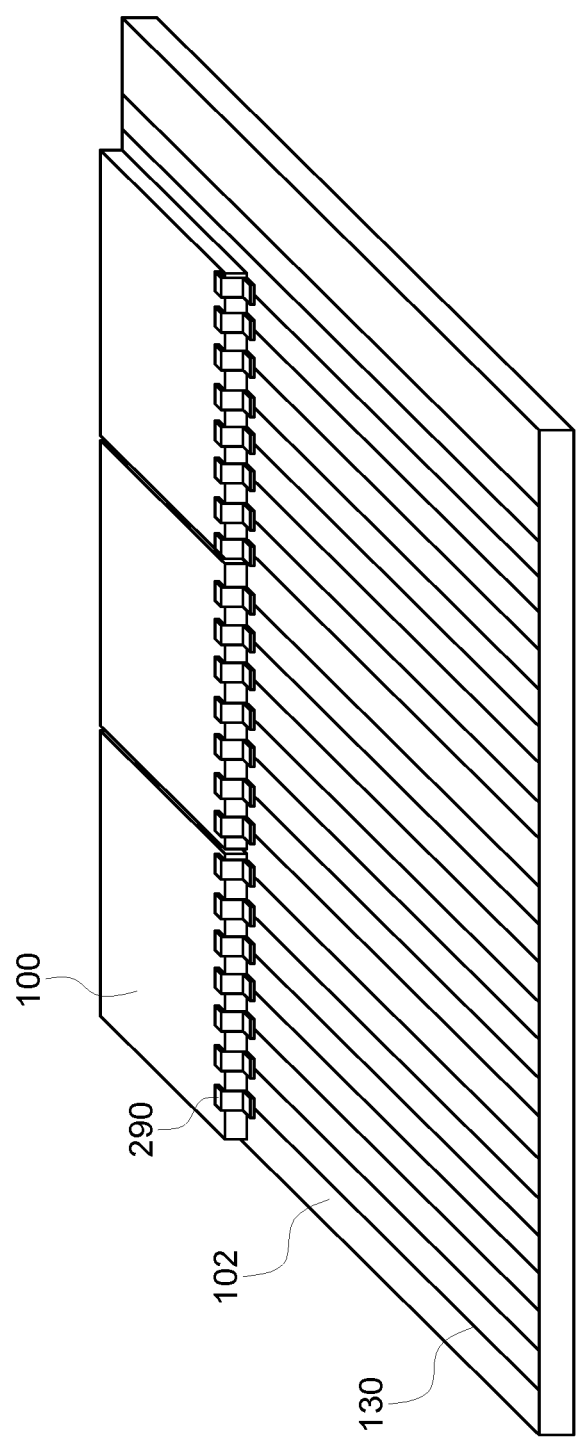
FIG. 8 depicts an example of the fabrication of one row of tiles of the detector panel of FIG. 7, in accordance with aspects of the present disclosure.
Figure 9:
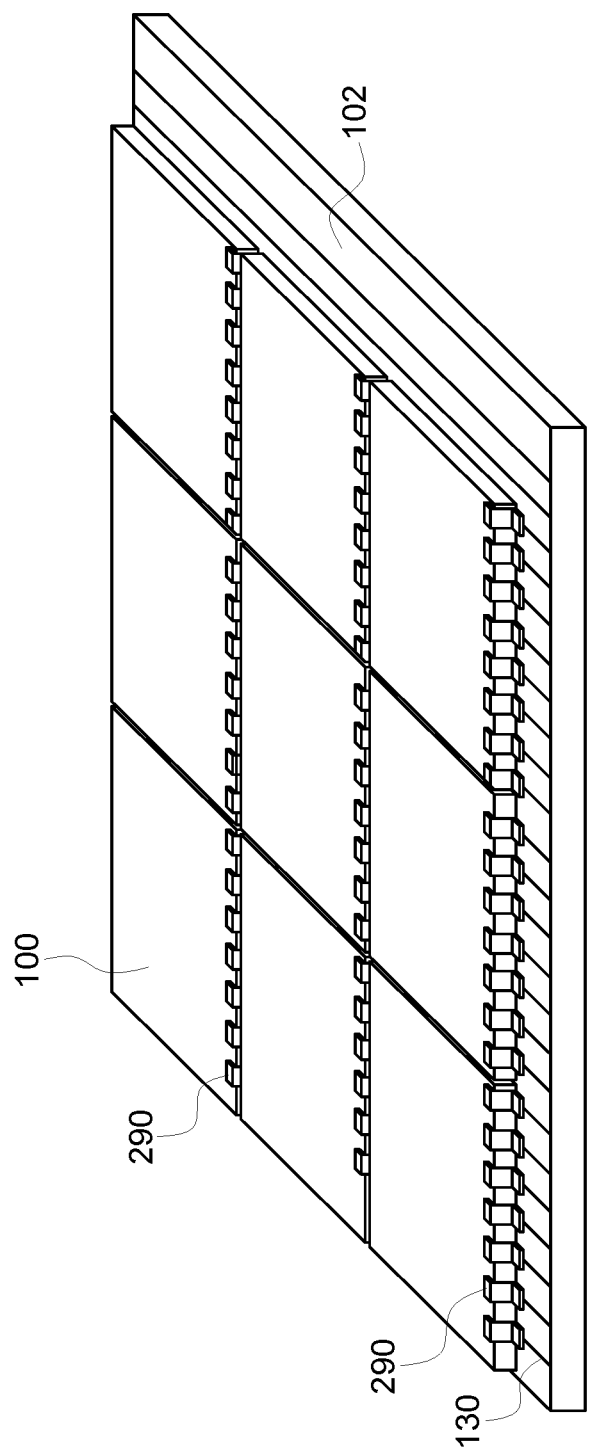
FIG. 9 depicts an example of the fabrication of additional row of tiles of the detector panel of FIG. 7, in accordance with aspects of the present disclosure.

Turning to FIGS. 8 and 9, a further illustration is provided of interconnecting CMOS tiles 100 in accordance with this approach. In particular, pads 250 on the same edge of each CMOS tile are connected to corresponding traces 130 via vertical bridges 250 formed (such as by 3D printing) on the respective vertical side wall of each CMOS tile 100. As shown in FIG. 9, this may be used to interconnect large numbers of tiles 100 to the same interconnect traces 130.

Turning to FIG. 10, a fabrication technique is shown that is suitable for forming external bridges, as discussed with respect to FIGS. 7-9. In this example, CMOS tiles 100 are aligned and attached in rows to the substrate 102. In certain implementations, standoffs 298 are used in the attachment and aligning process. A sidewall transition area 300 may be formed, such as using ultraviolet curable epoxy resin (FIG. 10, top). Using the sidewall transition area 300 and the sidewall of the CMOS tiles 100, the metalized interconnects 290 are 3D printed (or otherwise formed using additive fabrication) (FIG. 10, bottom) so as to connect pads 250 (e.g., I/O pads) on the tops of the CMOS tiles 100 to the interconnect traces 130 (e.g., data lines) on the top of the substrate 102. The interconnects 290 may be tested at this stage and additional rows of tiles 100 may be added to the substrate 102 to form the detector 22.

Technical effects of the invention include the use of four-side buttable CMOS tiles to fabricate detector panels, including large-area detector panels. Fabrication may utilize pads and interconnect structures formed on the top or bottom of the CMOS tiles. Electrical connection and readout may utilize readout and digitization circuitry provided on the CMOS tiles themselves such that readout of groups or sub-arrays of pixels occurs at the tile level, while tiles are then readout at the detector level such that readout operations are tiered or multi-level.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radiation detector comprising:
    a substrate comprising a plurality of conductive traces disposed on a surface of the substrate; and
    a tiled array of complementary metal-oxide-semiconductor (CMOS) tiles positioned on the substrate, wherein each CMOS title of the tiled array of CMOS tiles comprises a plurality of vias provided as electrical contacts, and wherein each via extends through a respective CMOS tile and is in electrical communication with a respective conductive trace on the substrate.

2. The radiation detector of claim 1, wherein each via on a respective CMOS title is in communication with a different sub-array of pixels formed on the respective CMOS title such that reading out data along the via corresponds to reading out the respective sub-array of pixels.

3. The radiation detector of claim 1, wherein each CMOS tile includes integrated readout circuitry configured to read out pixel data for a respective CMOS tile and to output a digital signal.

4. The radiation detector of claim 1, wherein each via comprises a metalized column formed through all or part of a thickness of a respective CMOS tile so as to provide electrical interconnection of different layers of the respective CMOS tile to the respective conductive trace on the substrate.

5. The radiation detector of claim 1, wherein the plurality of conductive traces comprises one or more of digital output lines and enables lines configured to acquire data from or controls readout of the CMOS tiles to which the plurality of conductive traces connects.

6. A method of fabricating a radiation detector comprising:
    positioning a plurality of complementary metal-oxide-semiconductor (CMOS) tiles on a substrate such that a portion of the CMOS tiles abut other CMOS tiles on four sides; and
    aligning and electrically connecting a plurality of vias formed in and extending through the CMOS tiles with respective conductive traces present on a surface of the substrate such that each via is in electrical contract with at least one conductive trace of a plurality of conductive traces on the substrate.

7. The method of claim 6, further comprising:
    fabricating the plurality of vias in each CMOS tile such that each via in a respective CMOS tile is conductively connected to a different sub-array of pixels formed on the respective CMOS tile.

8. The method of claim 7, wherein fabricating the plurality of vias comprises forming a metalized column through all or part of a thickness of a respective CMOS tile so as to provide electrical interconnection of different layers of the respective CMOS tile to the respective conductive tract of the substrate.

9. The method of claim 6, comprising:
    fabricating separate readout circuitry on each CMOS tile, wherein the readout circuitry is configured to read out pixel data for the respective CMOS tile and to output a digital signal.

10. The method of claim 6, wherein the plurality of conductive traces comprises one or more of digital output lines and enables lines configured to acquire data from or controls readout of the CMOS tiles to which the conductive traces connect.

11. A radiation detector comprising:
a substrate;
a tiled array of complementary metal-oxide-semiconductor (CMOS) tiles positioned on the substrate, wherein each CMOS tile comprises:
a plurality of conductive traces formed on a metalized top layer of a respective CMOS tile;
at least one contact pad formed on at least one end of each conductive trace; and
a plurality of conductive bridges formed between corresponding contact pads of adjacent CMOS tiles.

12. The radiation detector of claim 11, wherein each contact pad is in communication with a different sub-array of pixels formed on the respective CMOS tile such that reading out data through the contact pad corresponds to reading out of the respective sub-array of pixels.

13. The radiation detector of claim 11, wherein each CMOS tile includes integrated readout circuitry configured to read out pixel data for the respective CMOS tile and to output a digital signal.

14. The radiation detector of claim 11, further comprising a filler material disposed between adjacent CMOS tiles and under the respective conductive bridges spanning the adjacent CMOS tiles.

15. The radiation detector of claim 11, wherein the plurality of conductive traces comprises one or more of digital output lines and enables lines configured to acquire data from or controls readout of the CMOS tiles on which the plurality of conductive traces is formed.

16. A method of fabricating a radiation detector comprising:
positioning a plurality of complementary metal-oxide-semiconductor (CMOS) tiles on a substrate such that a portion of the CMOS tiles abut other CMOS tiles on four sides;
forming a plurality of conductive traces on a metalized top layer of on each CMOS tile of the plurality of CMOS tiles;
forming at least one contact pad on at least one end of each conductive trace of the plurality of conductive traces on each CMOS tile of the plurality of CMOS tiles; and
forming a respective conductive bridge between adjacent contacts pads formed on the metalized top layers of adjacent CMOS tiles to form electrical connections on respective tops of the plurality of CMOS tiles.

17. The method of claim 16, wherein each contact paid is in communication with a different sub-array of pixels formed on the respective CMOS tile such that reading out data through the contact pad corresponds to reading out the respective sub-array of pixels.

18. The method of claim 16, comprising:
fabricating separate readout circuitry on each CMOS tile, wherein the readout circuitry is configured to read out pixel data for the respective CMOS tile and to output a digital signal.

19. The method of claim 16, comprising:
depositing a filler material between adjacent CMOS tiles prior to forming the conductive bridges.

20. The method of claim 16, wherein the plurality of conductive traces comprises one or more of digital output lines and enables lines configured to acquire data from or controls readout of the CMOS tiles on which the plurality of conductive traces is formed.

* * * * *